United States Patent
Kang et al.

(10) Patent No.: US 11,075,640 B1
(45) Date of Patent: Jul. 27, 2021

(54) ANALOG TO DIGITAL CONVERTER DEVICE AND METHOD FOR CALIBRATING CLOCK SKEW

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Wen-Juh Kang, Hsinchu (TW); Yu-Chu Chen, Hsinchu (TW); Hsin-Han Han, Hsinchu (TW)

(73) Assignees: GLOBAL UNICHIP CORPORATION, Hsinchu (TW); TAIWAN SEMICONDUCTOR MANUFACTURING CO., LTD. :, Hsinchu (TW)

( * ) Notice: Subject to any disclaimer, the term of this patent is extended or adjusted under 35 U.S.C. 154(b) by 0 days.

(21) Appl. No.: 17/035,748

(22) Filed: Sep. 29, 2020

(30) Foreign Application Priority Data

May 20, 2020 (TW) ................................ 109116768

(51) Int. Cl.
*H03M 1/10* (2006.01)
*H03M 1/12* (2006.01)
*H03M 1/08* (2006.01)

(52) U.S. Cl.
CPC ....... *H03M 1/1028* (2013.01); *H03M 1/0836* (2013.01); *H03M 1/1023* (2013.01); *H03M 1/121* (2013.01); *H03M 1/1033* (2013.01)

(58) Field of Classification Search
CPC ............. H03M 1/0836; H03M 1/1023; H03M 1/1033; H03M 1/121

USPC ......................................... 341/118, 120, 155
See application file for complete search history.

(56) References Cited

U.S. PATENT DOCUMENTS

| | | | |
|---|---|---|---|
| 7,250,885 B1 * | 7/2007 | Nairn ................... | H03M 1/1215 341/141 |
| 9,000,962 B1 | 4/2015 | Leuciuc | |
| 9,270,291 B1 * | 2/2016 | Parnaby .............. | H03M 1/1028 |

FOREIGN PATENT DOCUMENTS

TW        I693799 B     5/2020

\* cited by examiner

*Primary Examiner* — Khai M Nguyen
(74) *Attorney, Agent, or Firm* — CKC & Partners Co., LLC

(57) ABSTRACT

An analog to digital converter (ADC) device includes ADC circuits, a calibration circuit, and a skew adjusting circuit. The ADC circuits are configured to convert an input signal according to interleaved clock signals to generate first quantized outputs. The calibration circuit is configured to perform at least one calibration operation according to the first quantized outputs to generate second quantized outputs. The skew adjusting circuit further includes a first adjusting circuit. The first adjusting circuit is configured to analyze adjacent clock signals according to part of the second quantized outputs to generate adjusting information. The skew adjusting circuit is configured to analyze time difference information within even-numbered sampling periods of the clock signals according to the second quantized outputs and the adjusting information to generate adjustment signals. The adjustment signals are configured to reduce clock skews of the ADC circuits.

10 Claims, 11 Drawing Sheets

US 11,075,640 B1

ANALOG TO DIGITAL CONVERTER DEVICE AND METHOD FOR CALIBRATING CLOCK SKEW

RELATED APPLICATIONS

The present application claims priority to Taiwan Application Serial Number 109116768, filed May 20, 2020, which is incorporated herein by reference in its entirety.

BACKGROUND

Technical Field

The present disclosure relates to an analog-to-digital converter (ADC) device. More particularly, the present disclosure relates to a time-interleaved ADC and a method for calibrating a clock skew thereof.

Description of Related Art

ADCs are commonly used in various electronic devices to convert analog signals to digital signals for signal processing. In practical applications, an ADC will affect its own resolution or linearity due to a gain error, a voltage error, or a timing error. With regard to the timing error, the prior art technologies need to dispose complex circuits (such as an additional reference ADC circuit, auxiliary ADC circuit) or utilize off-chip calibration to perform calibration. As a result, the power consumption of the ADC becomes increasingly higher or the demanded calibration period becomes increasingly longer.

For the foregoing reason, there is a need to resolve the above-mentioned problem by providing an ADC device and a method for calibrating a clock skew.

SUMMARY

In order to solve the problem mentioned above, one aspect of the present disclosure is to provide an ADC device which includes a number of ADC circuits, a calibration circuit, and a skew adjusting circuit. The ADC circuits are configured to convert an input signal to generate a number of first quantized outputs according to a number of interleaved clock signals. The calibration circuit is configured to perform at least one calibration operation according to the first quantized outputs to generate a number of second quantized outputs. The skew adjusting circuit further includes a first adjusting circuit. The first adjusting circuit is configured to analyze adjacent clock signals according to part of the second quantized outputs to generate adjusting information. The skew adjusting circuit is configured to analyze time difference information within even-numbered sampling periods of the clock signals according to the second quantized outputs and the adjusting information to generate a number of adjustment signals. The adjustment signals are configured to reduce clock skews of the ADC circuits.

Some aspects of the present disclosure provide a method for calibrating a clock skew. The method for calibrating the clock skew includes: performing at least one calibration operation according to a number of first quantized outputs generated by a number of ADC circuits to generate a number of second quantized outputs; analyzing adjacent clock signals according to part of the second quantized outputs by using a skew adjusting circuit to generate adjusting information; and analyzing time difference information within even-numbered sampling periods of clock signals according to the second quantized outputs and the adjusting information by using the skew adjusting circuit so as to generate a number of adjustment signals. The adjustment signals are configured to reduce clock skews of the ADC circuits.

The ADC device and method for calibrating the clock skew according to the present disclosure mainly utilize the analysis of the time difference information within even-numbered sampling periods of the plurality of clock signals and the auxiliary adjusting information to perform calibration. As a result, the clock skew can still be calibrated effectively when the frequency of the input signal is close to the Nyquist frequency. In this manner, the overall power consumption and calibration period can be reduced.

It is to be understood that both the foregoing general description and the following detailed description are by examples, and are intended to provide further explanation of the invention as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1A:
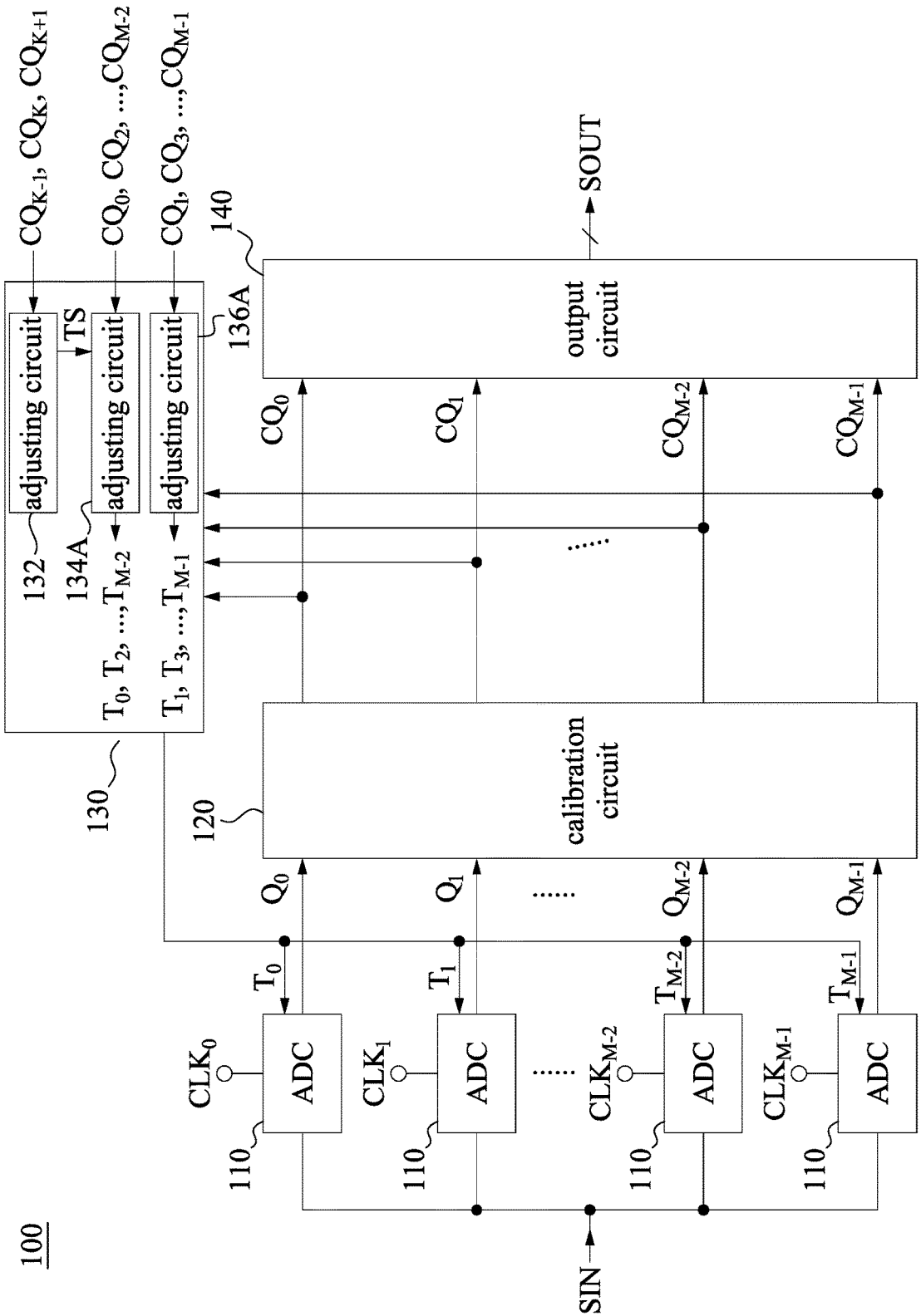
FIG. 1A depicts a schematic diagram of an ADC device according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

Figure 1B:
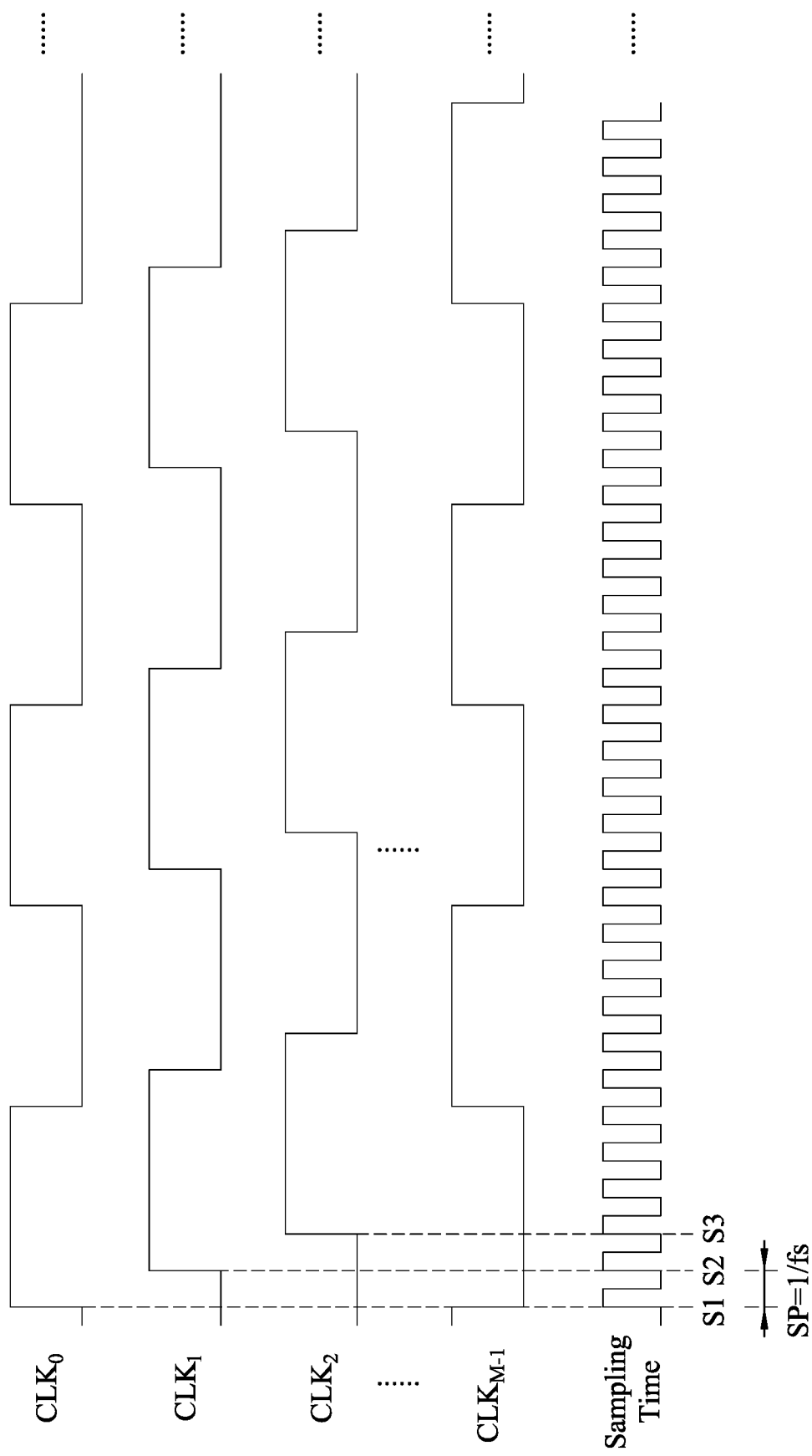
FIG. 1B depicts a schematic diagram of waveforms of a number of clock signals in FIG. 1A according to some embodiments of the present disclosure.

Reference is now made to FIG. 1A and FIG. 1B. FIG. 1A depicts a schematic diagram of an ADC device 100 according to some embodiments of the present disclosure. FIG. 1B depicts a schematic diagram of waveforms of a number of clock signals $CLK_0$-$CLK_{M-1}$ in FIG. 1A according to some embodiments of the present disclosure. In some embodiments, the ADC device 100 is operated to be a time-interleaved ADC with multiple channels.

In some embodiments, The ADC device 100 includes a number of ADC circuits 110, a calibration circuit 120, a skew adjusting circuit 130, and an output circuit 140. It is noted that each of the ADC circuits 110 is operated to be a signal channel. In other words, the ADC device 100 includes M channels in this example. In some embodiments, M is an even number. As shown in FIG. 1A, the ADC circuits 110 are configured to perform analog-to-digital conversions on an input signal SIN according to the clock signals $CLK_0$-$CLK_{M-1}$ to generate quantized outputs $Q_0$-$Q_{M-1}$ correspondingly.

As shown in FIG. 1B, there is a time interval between two adjacent clock signals of the clock signals $CLK_0$-$CLK_{M-1}$. Therefore, a first channel and a second channel perform sampling operations and analog-to-digital conversions at different times. For example, the first channel (that is, the ADC circuit 110 operated according to the clock signal $CLK_0$) samples the input signal SIN at a first sampling time S1 and performs the analog-to-digital conversion, and the second channel (that is, the ADC circuit 110 operating according to the clock signal $CLK_1$) samples the input signal SIN at a second sampling time S2 and performs the analog-to-digital conversion. A difference between the sampling time S1 and sampling time S2 is a sampling period SP, which corresponds to a sampling frequency fs, that is, SP=1/fs). By analogy, M channels can be operated according to multiple interleaved timings.

As mentioned above, the calibration circuit 120 is coupled to each of the ADC circuits 110 to receive the quantized outputs $Q_0$-$Q_{M-1}$. The calibration circuit 120 can perform at least one calibration computation according to the quantized outputs $Q_0$-$Q_{M-1}$ to calibrate offsets and gain errors of the ADC circuits 110, and generate a number of quantized outputs $CQ_0$-$CQ_{M-1}$ that have been calibrated.

In some embodiments, the calibration circuit 120 may be a foreground calibration circuit or a background calibration circuit. For example, the calibration circuit 120 may include a pseudo-random number generator circuit (not shown in the figure) and a digital processing circuit (not shown in the figure). The pseudo-random number generator circuit generates a calibration signal to the ADC circuits 110, and the digital processing circuit can perform an adaptive algorithm (that is, the at least one calibration computation described above) according to the quantized outputs $Q_0$-$Q_{M-1}$ to reduce the offsets or errors of the quantized outputs $Q_0$-$Q_{M-1}$. The above calibration circuit 120 is only for illustrative purpose, and the present disclosure is not limited in this regard. Various types of calibration computations and calibration circuits 120 are within the scope of the present disclosure.

As mentioned above, the skew adjusting circuit 130 is electrically coupled to the calibration circuit 120 to receive the quantized outputs $CQ_0$-$CQ_{M-1}$ that have been calibrated. In some embodiments, the skew adjusting circuit 130 can analyze clock skews (equivalent to phase errors) between the ADC circuits 110 according to the quantized outputs $CQ_0$-$CQ_{M-1}$ that have been calibrated to generate a number of adjustment signals $T_0$-$T_{M-1}$. In some embodiments, the skew adjusting circuit 130 outputs the adjustment signals $T_0$-$T_{M-1}$ respectively to the ADC circuits 110. The adjustment signals $T_0$-$T_{M-1}$ are configured to indicate timings required to be adjusted by the ADC circuits 110 due to the clock skews.

In greater detail (M is taken as an even number for example), the skew adjusting circuit 130 includes adjusting circuits 132, 134A, and 136A. The adjusting circuit 132 is configured to analyze adjacent clock signals according to part of the quantized outputs $CQ_k$, $CQ_{k-1}$, and $CQ_{k+1}$ in the quantized outputs $CQ_0$-$CQ_{M-1}$ to generate adjusting information TS, where K<M−1, and both K and M are positive integers. The adjusting circuit 134A is configured to analyze the even-numbered quantized outputs $CQ_0$, $CQ_2$ ... $CQ_{M-2}$ of the quantized outputs $CQ_0$-$CQ_{M-1}$ that have been calibrated to generate a first part (that is, $T_0$, $T_2$ ... $T_{M-2}$) of the adjustment signals $T_0$-$T_{M-1}$, and the adjusting circuit 136A is configured to analyze the odd-numbered quantized outputs $CQ_1$, $CQ_3$ ... $CQ_{M-1}$ of the quantized outputs $CQ_0$-$CQ_{M-1}$ that have been calibrated to generate a second part (that is, $T_1$, $T_3$ ... $T_{M-1}$) of the adjustment signals $T_0$-$T_{M-1}$.

The adjusting circuit 134A analyzes clock skews (equivalent to time difference information) between the even-numbered ADC circuits 110 according to the even-numbered quantized outputs $CQ_0$, $CQ_2$ ... $CQ_{M-2}$ to generate the adjustment signals $T_0$, $T_2$ ... $T_{M-2}$. Because the quantized output $CQ_0$ corresponds to the first sampling time S1 and the quantized output $CQ_2$ corresponds to a third sampling time S3, a time difference between the two corresponding times is 2 sampling periods SP. Therefore, time difference information within 2 sampling periods SP of the clock signal $CLK_0$ and the clock signal $CLK_2$ can be obtained by analyzing the quantized output $CQ_0$ and the quantized output $CQ_2$. By analogy, time difference information within 2 sampling periods SP of the clock signals $CLK_0$, $CLK_2$ ... $CLK_{M-2}$ can be analyzed by the adjusting circuit 134A, by using this disposition method.

Similarly, clock skews between the odd-numbered ADC circuits 110 can be analyzed by the adjusting circuit 136A, according to the odd-numbered quantized outputs $CQ_1$, $CQ_3$ ... $CQ_{M-1}$, to generate the adjustment signals $T_1$, $T_3$ ... $T_{M-1}$. By using this disposition method, time difference information within 2 sampling periods SP of the clock signals $CLK_1$, $CLK_3$ ... $CLK_{M-1}$ can be analyzed by the adjusting circuit 136A.

In some embodiments, the ADC circuits 110 can adjust the execution timings of the sampling operations and/or the analog-to-digital conversion operations according to the adjustment signals $T_0$-$T_{M-1}$ to calibrate the clock skews equivalently. Or, timings of the clock signals $CLK_0$-$CLK_{M-1}$ can be adjusted directly according to the adjustment signals $T_0$-$T_{M-1}$ to reduce the clock skews equivalently in some embodiments. For example, the adjustment signals $T_0$-$T_{M-1}$ are inputted to a clock generator, a phase interpolator, or a digital delay control line configured to generate the clock signal $CLK_0$-$CLK_{M-1}$ so as to adjust phases of the clock signals $CLK_0$-$CLK_{M-1}$. The above disposition method of for reducing the clock skews according to the adjustment signals $T_0$-$T_{M-1}$ is only for illustrative purpose, and the present disclosure is not limited in this regard.

As mentioned previously, the output circuit 140 is electrically coupled to the calibration circuit 120 to receive the quantized outputs $CQ_0$-$CQ_{M-1}$ that have been calibrated. The output circuit 140 performs a data combination operation according to the quantized outputs $CQ_0$-$CQ_{M-1}$ that have been calibrated to generate a digital signal SOUT. By using the data combination operation, the quantized outputs $CQ_0$-$CQ_{M-1}$ provided by the M channels can be combined into the single digital signal SOUT having the sampling frequency fs. The sampling frequency fs is M times of a frequency of the clock signal. In some embodiments, the output circuit 140 may be implemented by using a multiplexer circuit, but the present disclosure is not limited in this regard.

The adjusting circuit 134A is configured to perform statistical operations to determine a number of calculation signals (such as $M_0$, $M_2$ ... $M_{M-2}$ in FIG. 2B) respectively corresponding to the even-numbered quantized outputs $CQ_0$, $CQ_2$ ... $CQ_{M-2}$, and average these calculation signals to generate a reference signal (such as REF1 in FIG. 2B). The adjusting circuit 134A further compares the reference signal with the calculation signals to generate the adjustment signals $T_0$, $T_2$ ... $T_{M-2}$ as mentioned above. The operations here will be explained in detail in the following paragraphs with reference to FIG. 2B.

Similarly, in some embodiments, the adjusting circuit 136A is configured to perform statistical operations to determine a number of calculation signals (such as $M_1$, $M_3$ ... $M_{M-1}$ in FIG. 2C) respectively corresponding to the odd-numbered quantized outputs $CQ_1$, $CQ_3$ ... $CQ_{M-1}$, and average these calculation signals to generate a reference signal (such as REF2 in FIG. 2C). The adjusting circuit 136A further compares the reference signal with the calculation signals to generate the adjustment signals $T_1$, $T_3$ ... $T_{M-1}$ as mentioned above.

In some embodiments, the ADC circuits 110 can adjust the execution timings of the sampling operation and/or the analog-to-digital conversion operation according to the adjustment signals $T_0$-$T_{M-1}$ to calibrate the clock skews equivalently. Since the operations of the ADC circuits 110 are similar to those of the foregoing embodiment, a description in this regard is not provided here.

Figure 2A:
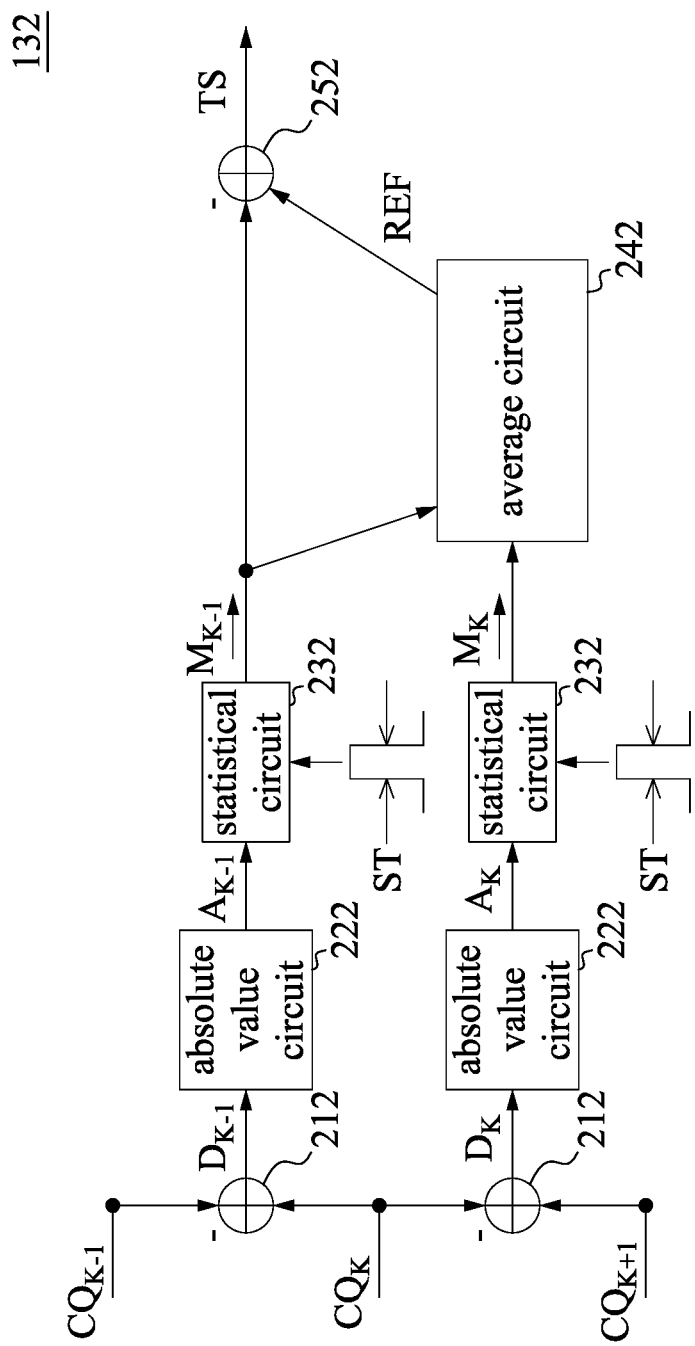
FIG. 2A depicts a schematic circuit diagram of the adjusting circuit in FIG. 1A according to some embodiments of the present disclosure.
Figure 2B:
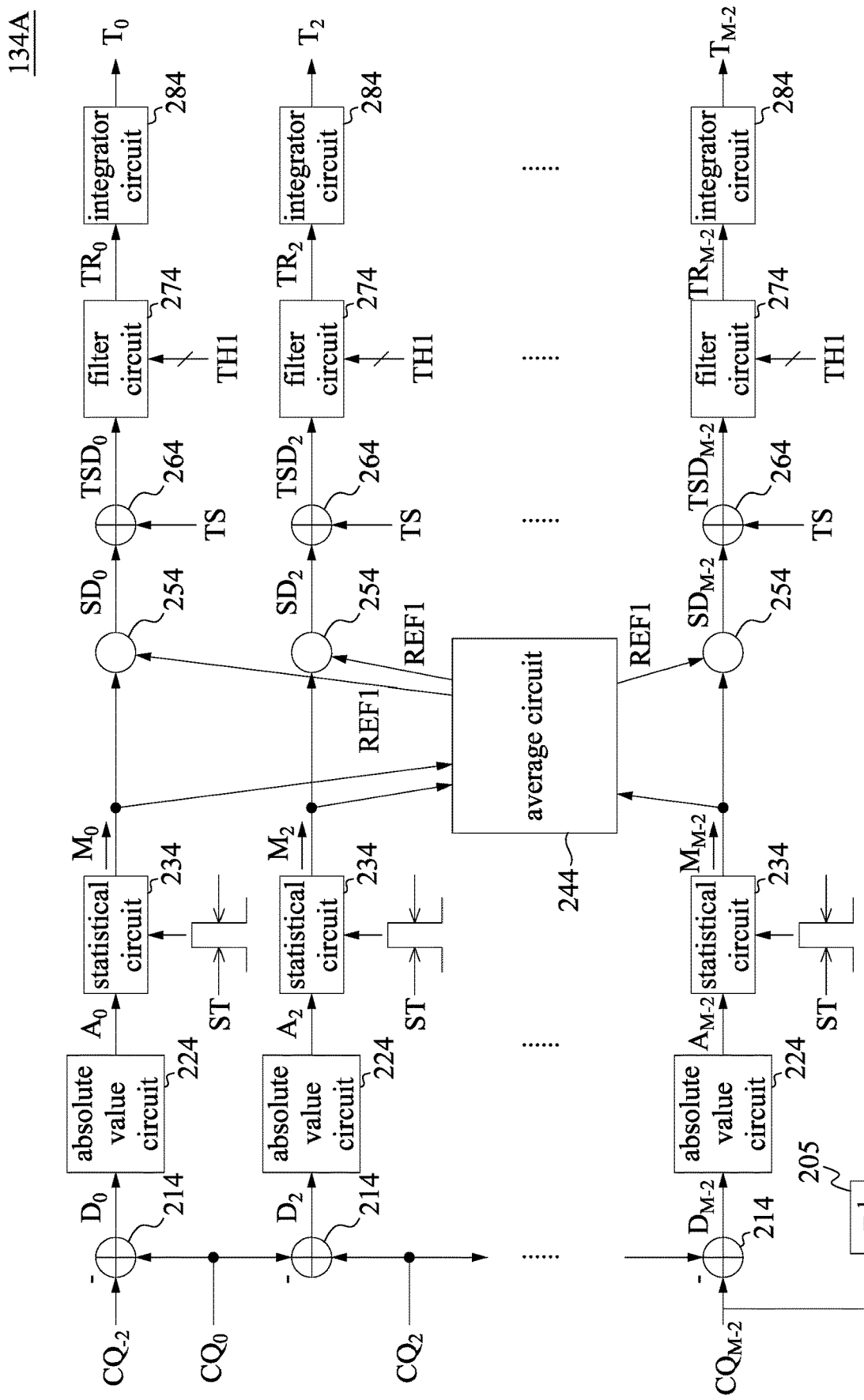
FIG. 2B depicts a schematic circuit diagram of the adjusting circuit in FIG. 1A according to some embodiments of the present disclosure.
Figure 2C:
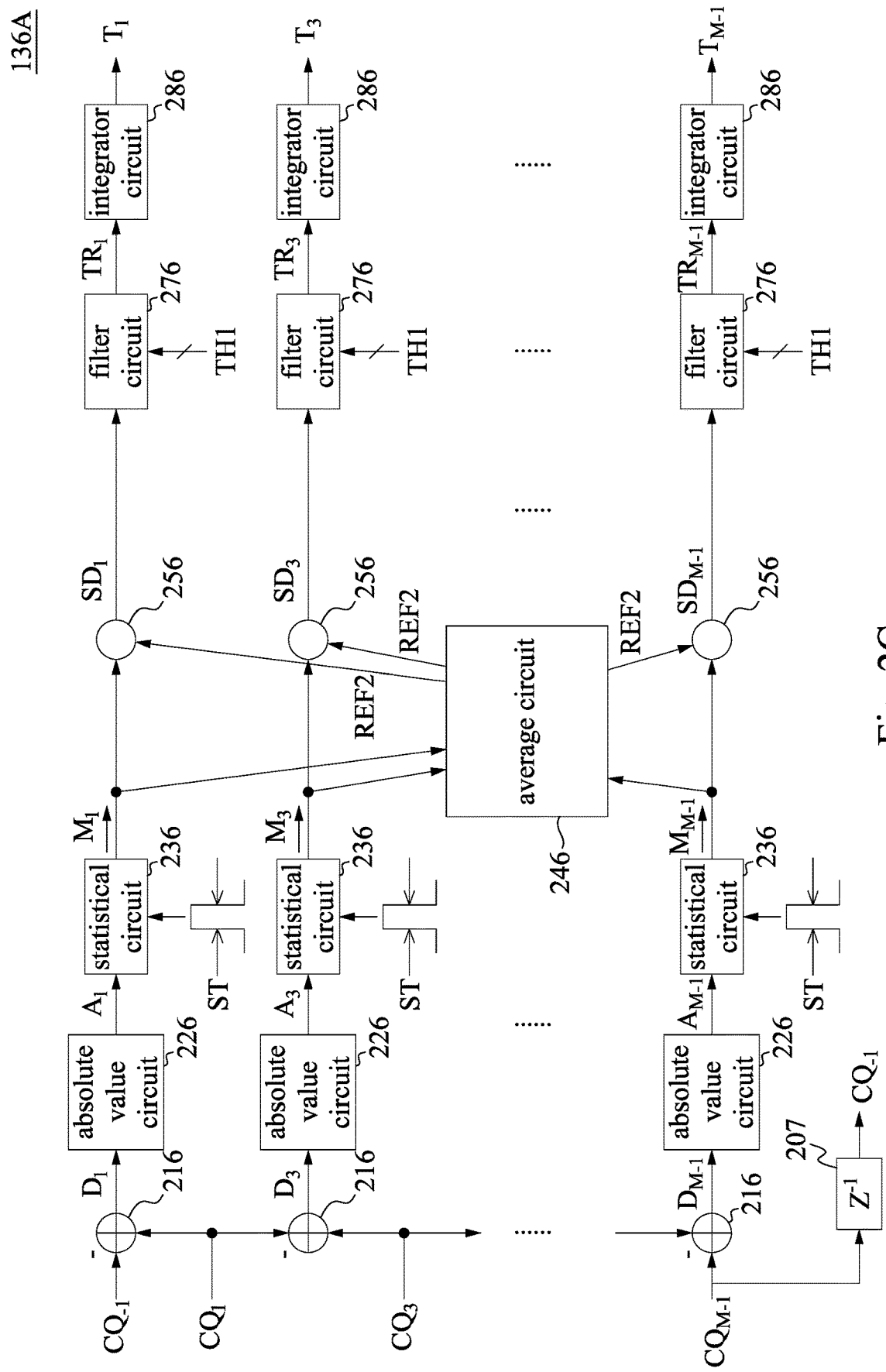
FIG. 2C depicts a schematic circuit diagram of the adjusting circuit in FIG. 1A according to some embodiments of the present disclosure.

Reference is now made FIG. 2A to FIG. 2C. FIG. 2A to FIG. 2C are schematic circuit diagrams of adjusting circuits in FIG. 1A according to some embodiments of the present disclosure. For ease of understanding, similar elements in FIG. 2A to FIG. 2C are designated with the same reference numbers as in FIG. 1A. In the embodiment shown in FIG. 1A, the adjusting circuit 132 is configured to transmit adjusting information TS to the adjusting circuit 134A. The adjusting circuit 132 includes a number of arithmetic circuits 212, a number of absolute value circuits 222, a number of statistical circuits 232, an average circuit 242, and a comparison circuit 252.

It is noted that in the embodiment shown in FIG. 2A, the adjusting circuit 132 only receives three quantized outputs $CQ_{k-1}$, $CQ_k$, $CQ_{k+1}$. However, more than three quantized outputs may be utilized to generate the adjusting information TS, and the present disclosure is not limited in this regard.

As mentioned above, the arithmetic circuits 212 are electrically coupled to the calibration circuit 120 in FIG. 1A. The arithmetic circuits 212 receive part of the quantized outputs $CQ_{k-1}$, $CQ_k$, $CQ_{k+1}$, and one of the above computation circuits 212 is configured to generate a difference signal $D_{k-1}$ according to the quantized outputs $CQ_{k-1}$, $CQ_k$, $CQ_{k+1}$. Another one of the above computation circuits 212 is configured to generate a difference signal $D_k$ according to the quantized outputs $CQ_k$, $CQ_{k+1}$. The first computation circuit 212 is taken for example. The first computation circuit 212 receives the quantized outputs $CQ_{k-1}$ and $CQ_k$, and subtracts the quantized output $CQ_{k-1}$ from the quantized output $CQ_k$ to generate the difference signal $D_{k-1}$. Since the disposition method and operation of the remaining computation circuits 212 can be deduced by analogy, a description in this regard is not repeated here. In some embodiments, the computation circuit 212 may be implemented by using a subtractor or some other processing circuit having the same function. Various circuits that can realize the computation circuit 212 are within the scope of the present disclosure.

The absolute value circuits 222 are electrically coupled to the computation circuits 212 to receive the difference signals $D_{k-1}$ and $D_k$. Each of the absolute value circuits 222 performs an absolute value operation according to a difference signal of the difference signals $D_{k-1}$ and $D_k$ correspondingly to generate one of the absolute value signals $A_{k-1}$ and $A_k$ correspondingly. The first absolute value circuit 222 is taken for example. The first absolute value circuit 222 receives the difference signal $D_{k-1}$, and performs the absolute value operation to obtain an absolute value of the difference signal $D_{k-1}$ so as to generate the absolute value signal $A_{k-1}$. Since the disposition method and operation of the remaining absolute value circuits 222 can be deduced by analogy, a description in this regard is not repeated here. In some embodiments, the absolute value circuit 222 may be implemented by using a processing circuit or a rectifier circuit. Various circuits that can realize the absolute value circuit 222 are within the scope of the present disclosure.

As mentioned above, the statistical circuits 232 are respectively coupled to the absolute value circuits 222 to receive the absolute value signals $A_{k-1}$ and $A_k$. Each of the statistical circuits 232 is configured to continuously receive one of the absolute value signals $A_{k-1}$ and $A_k$ correspondingly during a predetermined period ST, and perform a statistical operation to output the calculation signal $M_{k-1}$ or $M_k$ correspondingly.

In some embodiments, the above statistical operation may be a maximum value operation or an average value operation. The first statistical circuit 232 is taken for example. The first statistical circuit 232 continuously receives the absolute value signal $A_{k-1}$ during the predetermined period ST, and performs the maximum value operation to output the maximum absolute value signal $A_{k-1}$ received during the predetermined period ST as the calculation signal $M_{k-1}$. Or, the first statistical circuit 232 continuously receives the absolute value signal $A_{k-1}$ during the predetermined period ST, and performs the average value operation to average all the absolute value signals $A_{k-1}$ received during the predetermined period ST as the calculation signal $M_{k-1}$. Since the disposition method and operation of the remaining statistical circuits 232 can be deduced by analogy, a description in this regard is not repeated here.

In some embodiments, the statistical circuit 232 may be implemented by using a digital processing circuit, a comparator circuit, and/or or a register circuit, but the present disclosure is not limited in this regard. Various circuits that can realize the statistical circuit 232 are within the scope of the present disclosure.

As mentioned above, the average circuit 242 is electrically coupled to the statistical circuits 232 to receive the calculation signals $M_{k-1}$ and $M_k$. The average circuit 242 is configured to perform an average value operation according to the calculation signals $M_{k-1}$ and $M_k$ to average the calculation signals $M_{k-1}$ and $M_k$ so as to generate a reference signal REF. In some embodiments, the average circuit 242 may be implemented by using a digital processing circuit, but the present disclosure is not limited in this regard.

As mentioned above, the comparison circuit 252 is coupled to the average circuit 242 to receive the reference signal REF. The comparison circuit 252 is configured to the calculation signal $M_{k-1}$ and the reference signal REF so as to generate the adjusting information TS. Since the disposition method and operation of the remaining comparison circuits 252 can be deduced by analogy, a description in this regard is not repeated here. In some embodiments, the comparison circuit 252 may be implemented by using a comparator. Or, the comparison circuit 252 may be implemented by using a subtractor circuit in some embodiments, and subtracts the corresponding calculation signal $M_{k-1}$ from the reference signal REF to generate the adjusting information TS. The above implementation method of the comparison circuit 252 is only for illustrative purpose, and the present disclosure is not limited in this regard.

As mentioned above, the adjusting circuit 132 is configured to calculate and generate the adjusting information TS, and transmit the adjusting information TS to the adjusting circuit 134A. The adjusting information TS is generated according to the clock information of adjacent quantized outputs. In other words, the skew adjusting circuit 130 analyzes the clock skews (equivalent to the phase errors) between the ADC circuits 110 according to the quantized outputs $CQ_0$-$CQ_{M-1}$ that have been calibrated to therefore generate the adjusting information TS. Then, the skew adjusting circuit 130 generates the adjustment signals $T_0$-$T_{M-1}$ according to the adjusting information TS to allow the corresponding ADC circuits 110 to adjust the execution timings of the sampling operations and/or the analog-to-digital conversion operations according to the adjustment signals $T_0$-$T_{M-1}$ so as to calibrate the clock skews equivalently. According to the above, the skew adjusting circuit 130 or the adjusting information TS generated by it helps the phase errors between different channels (that is, the different ADC circuits 110) converge to zero correctly.

After that, as shown in FIG. 2B, the adjusting circuit 134A includes a delay circuit 205, a number of computation circuits 214, a number of absolute value circuits 224, a number of statistical circuits 234, an average circuit 244, a number of comparison circuits 254, and a number of computation circuits 264.

As mentioned above, the delay circuit 205 is configured to delay the quantized output $CQ_{M-2}$ to generate a delayed quantized output $CQ_{-2}$. In some embodiments, a delay time introduced by the delay circuit 205 is equivalent to a period M×SP in FIG. 1B. The delay circuit 205 may be implemented by using various digital circuits, such as a buffer, an inverter, a filters, etc. The above implementation method of the delay circuit 205 is only for illustrative purpose, and the present disclosure is not limited in this regard.

The computation circuits 214 are electrically coupled to the calibration circuit 120 in FIG. 1A. The computation circuits 214 receive two of the even-numbered quantized outputs $CQ_0$, $CQ_2$ . . . $CQ_{M-2}$ in sequence to respectively generate a number of difference signals $D_0$, $D_2$ . . . $D_{M-2}$. The first computation circuit 214 is taken for example. The first computation circuit 214 receives the quantized outputs $CQ_{-2}$ and $CQ_0$, and subtracts the quantized output $CQ_{-2}$ from the quantized output $CQ_0$ to generate the difference signal $D_0$. Since the disposition method and operation of the remaining computation circuits 214 can be deduced by analogy, a description in this regard is not repeated here. In some embodiments, the implementation method of the computation circuit 214 is similar to that of the computation circuit 212, so a description in this regard is not provided.

The absolute value circuits 224 are electrically coupled to the computation circuits 214, respectively, to receive the difference signals $D_0$, $D_2$ . . . $D_{M-2}$. Each of the absolute value circuits 224 performs an absolute value operation according to a corresponding difference signal in the difference signals $D_0$, $D_2$ . . . $D_{M-2}$ to generate one of a number of absolute value signals $A_0$, $A_2$ . . . $A_{M-2}$ correspondingly. The first absolute value circuit 224 is taken for example. The first absolute value circuit 224 receives the difference signal $D_0$, and performs the absolute value operation to obtain an absolute value of the difference signal $D_0$ so as to generate the absolute value signal $A_0$. Since the disposition method and operation of the remaining absolute value circuits 224 can be deduced by analogy, a description in this regard is not repeated here. In some embodiments, the implementation method of the absolute value circuit 224 is similar to that of the absolute value circuit 222, so a description in this regard is not provided.

As mentioned above, the statistical circuits 234 are respectively coupled to the absolute value circuits 224 to receive the absolute value signals $A_0$, $A_2$ . . . $A_{M-2}$. Each of the statistical circuits 234 is configured to continuously receive one absolute value signal in the absolute value signals $A_0$, $A_2$ . . . $A_{M-2}$ correspondingly during the predetermined period ST, and perform a statistical operation to output one of the calculation signals $M_0$, $M_2$ . . . $M_{M-2}$ correspondingly.

In some embodiments, the above statistical operation may be a maximum value operation or an average value operation. The first statistical circuit 234 is taken for example. The first statistical circuit 234 continuously receives the absolute value signal $A_0$ during the predetermined period ST, and performs the maximum value operation to output the maximum absolute value signal $A_0$ received during the predetermined period ST as the calculation signal $M_0$. Or, the first statistical circuit 234 continuously receives the absolute value signal $A_0$ during the predetermined period ST, and performs the average value operation to average all the absolute value signals $A_0$ received during the predetermined period ST as the calculation signal $M_0$. Since the disposition method and operation of the remaining statistical circuits 234 can be deduced by analogy, a description in this regard is not repeated here.

In some embodiments, the statistical circuit 234 may be implemented by using a digital processing circuit, a comparator circuit, and/or or a register circuit, but the present disclosure is not limited in this regard. Various circuits that can realize the statistical circuit 234 are within the scope of the present disclosure.

As mentioned above, the average circuit 244 is electrically coupled to the statistical circuits 234 to receive the calculation signals $M_0$, $M_2$ . . . $M_{M-2}$. The average circuit 244 is configured to perform an average value operation according to the plurality of calculation signals $M_0$, $M_2$ . . . $M_{M-2}$ to average the plurality of calculation signals $M_0$, $M_2$ . . . $M_{M-2}$ so as to generate the reference signal REF1. In some embodiments, the average circuit 244 may be implemented by using a digital processing circuit, but the present disclosure is not limited in this regard.

The comparison circuits 254 are coupled to the average circuit 244 to receive the reference signal REF1. The comparison circuits 254 are configured to respectively compare the calculation signals $M_0$, $M_2$ . . . $M_{M-2}$ with the reference signal REF1 so as to generate detection signals $SD_0$, $SD_2$ . . . $SD_{M-2}$ correspondingly. The first comparison circuit 254 is taken for example. The first comparison circuit 254 compares the calculation signal $M_0$ with the reference signal REF1 to generate the detection signal $SD_0$. Since the disposition method and operation of the remaining comparison circuits 254 can be deduced by analogy, a description in this regard is not repeated here. In some embodiments, the implementation method of the comparison circuit 254 is similar to that of the comparison circuit 252, so a description in this regard is not provided.

The computation circuits 264 are electrically coupled to the comparison circuits 254. The computation circuits 264 receive the detection signals $SD_0$, $SD_2$ . . . $SD_{M-2}$ in sequence correspondingly to perform addition operations with the adjusting information TS so as to generate detection signals $TSD_0$, $TSD_2$ . . . $TSD_{M-2}$ that have been adjusted. The first computation circuit 264 is taken for example. The first computation circuit 264 receives the detection signal $SD_0$ and the adjusting information TS, and adds the detection signal $SD_0$ to the adjusting information TS to generate the detection signals $TSD_0$ that has been adjusted. Since the disposition method and operation of the remaining computation circuits 264 can be deduced by analogy, a description in this regard is not repeated here. In some embodiments, the computation circuit 264 may be implemented by using an adder or some other processing circuit having the same function. Various circuits that can realize the computation circuit 264 are within the scope of the present disclosure.

In some embodiments, the detection signals $TSD_0$, $TSD_2 \ldots TSD_{M-2}$ that have been adjusted can be directly outputted as the adjustment signals $T_0, T_2 \ldots T_{M-2}$ of FIG. 1A. In some embodiments, the difference signals $D_0$, $D_2 \ldots D_{M-2}$ (or the detection signals $TSD_0$, $TSD_2 \ldots TSD_{M-2}$ that have been adjusted) are related to time information of the clock skews in the even-numbered channels, which can reflect the clock skews generated on the corresponding even-numbered ADC circuits 110. The operation of the first computation circuit 214 is taken for example. As shown in FIG. 2B, since the adjustment signal $T_0$ is generated according to a difference between the quantized output $CQ_{-2}$ and the quantized output $CQ_0$, the adjustment signal $T_0$ can be configured to indicate a time difference between the sampling time S1 corresponding to the quantized output $CQ_0$ and the sampling time S3 corresponding to the quantized output $CQ_{-2}$. The difference signal $D_0$ can be derived as the following formula (1) in the time domain:

$$CQ_0 - CQ_{-2} \approx \sin(2\pi f(k+2)T) - \sin(2\pi fk(T+\Delta t)) \approx \cos(2\pi fkT + 2\pi fT + 2\pi fk\Delta T) \cdot \sin(2\pi fT - \pi fk\Delta t) \quad (1)$$

Where (k+2)T is used to indicate the sampling time point corresponding to the quantized output $CQ_0$, k is used to indicate the sampling time point corresponding to the quantized output $CQ_{-2}$, f is a frequency of the input signal SIN, T is the above-mentioned sampling period SP, $\Delta t$ is the time difference.

If the frequency f is much lower than ½T, the formula (1) can be further derived as the following formula (2):

$$\sin(2\pi f(k+2)T) - \sin(2\pi fk(T+\Delta t)) \approx 2 \cos(2\pi fkT + 2\pi fT + \pi kf\Delta t) \cdot (2\pi fT - \#fk\Delta t) \quad (2)$$

Accordingly, by comparing the calculation signal $M_0$ with the reference signal REF1, the influence of the time difference $\Delta t$ caused by the clock skew can be obtained. For example, if the calculation signal $M_0$ is greater than the reference signal REF1, it means that the influence of the time difference $\Delta t$ is positive. Under this condition, the clock skew causes the phase of the clock signal $CLK_0$ to lead incorrectly. Or, if the calculation signal $M_0$ is lower than the reference signal REF1, it means that the influence of the time difference $\Delta t$ is negative. Under this condition, the clock skew causes the phase of the clock signal $CLK_0$ to lag incorrectly. Therefore, the detection signal $SD_0$ will have different logic values according to different comparison results to reflect phase information that the first ADC circuit 110 needs to be adjusted due to the clock skew. By analogy, the above various operations can be applied to the various adjustment signals $T_0, T_2 \ldots T_{M-2}$ and detection signals $SD_0$, $SD_2 \ldots SD_{M-2}$, so a description in this regard is not repeated here.

In some further embodiments, the adjusting circuit 134A may further include a number of filter circuits 274 and a number of integrator circuits 284. The filter circuits 274 are respectively coupled to the computation circuits 264 to receive the detection signals $TSD_0$, $TSD_2 \ldots TSD_{M-2}$ that have been adjusted.

The filter circuits 274 generate a number of trigger signals $TR_0, TR_2 \ldots TR_{M-2}$ according to the detection signals $TSD_0$, $TSD_2 \ldots TSD_{M-2}$ that have been adjusted and at least one threshold value TH1. The integrator circuits 284 are respectively coupled to the filter circuits 274 to receive the trigger signals $TR_0, TR_2 \ldots TR_{M-2}$. The integrator circuits 284 generate the adjustment signals $T_0, T_2 \ldots T_{M-2}$ according to the trigger signals $TR_0, TR_2 \ldots TR_{M-2}$.

As mentioned above, the first filter circuit 274 and the first integrator circuit 284 are taken for example. The filter circuit 274 is electrically coupled to the first computation circuit 264 to receive the detection signal $TSD_0$ that has been adjusted. In some embodiments, the filter circuit 274 can continuously accumulate the detection signals $TSD_0$ that have been adjusted, and compare the accumulated detection signal $TSD_0$ that has been adjusted with at least a threshold value TH1 to output one or more trigger signals $TR_0$. For example, when the accumulated detection signal $TSD_0$ that has been adjusted is greater than at least one threshold value TH1, the filter circuit 274 outputs the accumulated detection signal $TSD_0$ that has been adjusted as the corresponding trigger signal $TR_0$. The first integrator circuit 284 is coupled to the first filter circuit 274 to receive the trigger signal $TR_0$. The integrator circuit 284 is configured to accumulate the trigger signals $TR_0$ and output the accumulated trigger signal $TR_0$ as the adjustment signal $T_0$ so as to match different timing control methods. Since the disposition methods and operations of the remaining filter circuits 274 and integrator circuits 284 can be deduced by analogy, a description in this regard is not repeated here.

By disposing the filter circuit 274, the number of times of calibrating the clock skew can be reduced, thus reducing the dynamic power consumption of the ADC device 100. At the same time, the jitter caused by clock skew calibrations can also be reduced by disposing the filter circuit 274. By disposing the integrator circuit 284, the timing adjustment method can be matched as a corresponding value adjustment method. In practical applications, the filter circuit 274 and the integrator circuit 284 may be selectively disposed depending on practical needs. In addition, the above threshold value TH1 may also be adjusted depending on practical needs.

In different embodiments, the above filter circuit 274 and integrator circuit 284 may be implemented by using at least one comparator (for example, it can be configured to compare the accumulated trigger signal with the threshold value TH1 or compare the trigger signal), at least one register (for example, it can be configured to store the above accumulated signal or accumulated trigger signal, etc.), at least one clear circuit (for example, it can be configured to clear the data in the above register), and/or at least one computation circuit (for example, it can be configured to generate the accumulated signal or used to accumulate the trigger signals). The above disposition methods of the filter circuit 274 and the integrator circuit 284 are only for illustrative purpose, and the present disclosure is not limited in this regard.

As mentioned previously, the adjusting circuit 136A includes a delay circuit 207, a number of computation circuits 216, a number of absolute value circuits 226, a number of statistical circuits 236, an averaging circuit 246, and a number of comparison circuits 256, as shown in FIG. 2C.

The delay circuit 207 is configured to delay the quantized output $CQ_{M-1}$ to generate a delayed quantized output $CQ_{-1}$.

The computation circuits 216 receive two of the odd-numbered quantized outputs $CQ_{-1}$, $CQ_1$ ... $CQ_{M-1}$ in sequence to respectively generate a number of difference signals $D_1$, $D_3$ ... $D_{M-1}$. The absolute value circuits 226 are electrically coupled to the computation circuits 216, respectively, to receive the difference signals $D_1$, $D_3$ ... $D_{M-1}$ and generate a number of absolute value signals $A_1$, $A_3$ ... $A_{M-1}$. The statistical circuits 236 respectively receive the absolute value signals $A_1$, $A_3$ ... $A_{M-1}$ and output the calculation signals $M_1$, $M_3$ ... $M_{M-1}$. The average circuit 246 is configured to average the calculation signals $M_1$, $M_3$ ... $M_{M-1}$ to generate the reference signal REF2. The comparison circuits 256 are configured to respectively compare the calculation signals $M_1$, $M_3$ ... $M_{M-1}$ with the reference signal REF2 to generate detection signals $SD_1$, $SD_3$ ... $SD_{M-1}$ correspondingly. Since the operation methods of the adjusting circuit 136A are all the same as those of the adjusting circuit 134A, a description in this regard is not repeated here.

In some further embodiments, the adjusting circuit 136A may further include a number of filter circuits 276 and a number of integrator circuits 286. The filter circuits 276 generate a number of trigger signals $TR_1$, $TR_3$ ... $TR_{M-1}$ correspondingly according to the detection signals $SD_1$-$SD_{M-1}$. The integrator circuits 286 generate the adjustment signals $T_1$, $T_3$ ... $T_{M-1}$ according to the trigger signals $TR_1$, $TR_3$ ... $TR_{M-1}$. Since the operations of the filter circuit 276 and the integrator circuit 286 are all similar to those of the filter circuit 274 and the integrator circuit 284, a description in this regard is not repeated here.

Figure 3:
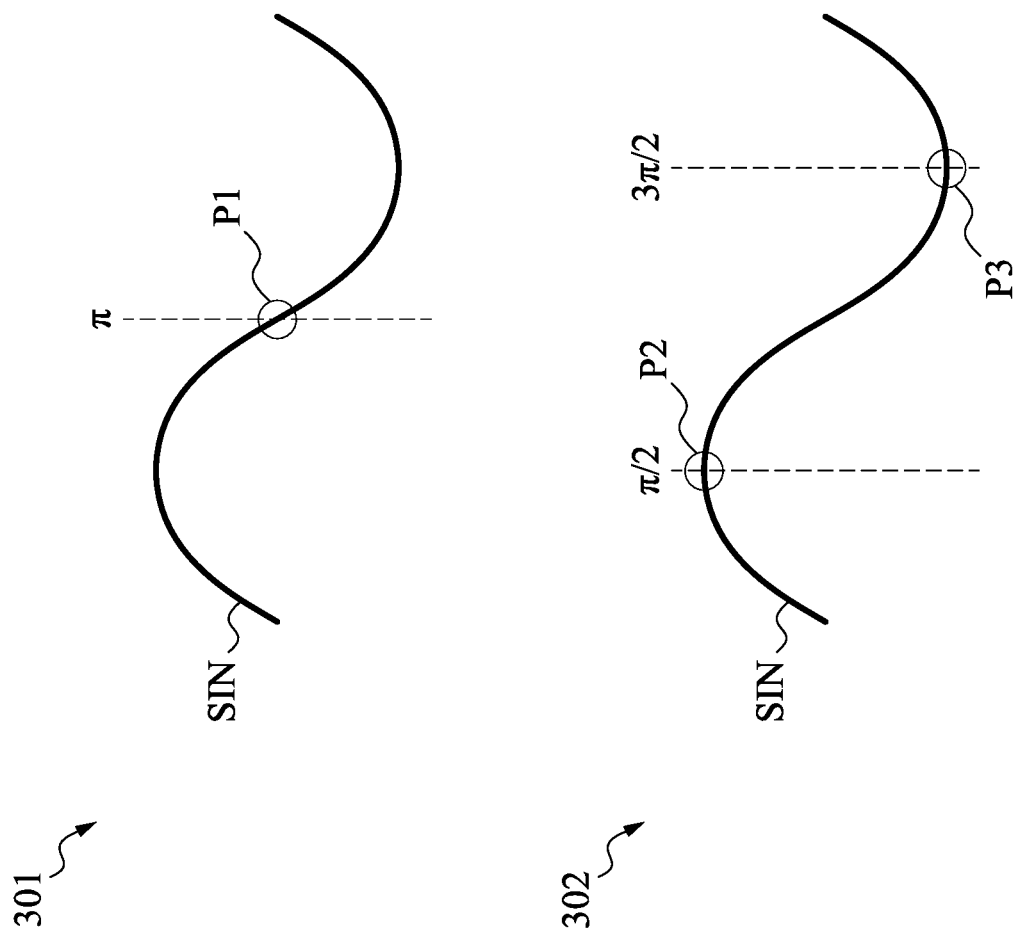
FIG. 3 depicts a waveform diagram of an input signal SIN according to some embodiments of the present disclosure.

Reference is now made to FIG. 3. FIG. 3 depicts a waveform diagram of the input signal SIN according to some embodiments of the present disclosure. Under some circumstances, when the frequency f of the input signal SIN is close to ½ the sampling frequency fs (Nyquist frequency), that is, when f≈½TS, the following formula (3) can be derived from the above formula (1):

$$CQ_0 - CQ_{-2} \approx 2\cos(2\pi fkT + 2\pi fT + \pi f\Delta T) \cdot \sin(\pi - \pi fk\Delta t) \quad (3)$$

According to formula (3), it can be understood that the information of the time difference Δt is related to the factor sin(π). As shown in a waveform 301, when the input signal SIN corresponds to the phase angle 7, the corresponding sampling point P1 is located at a position with a largest slope in the input signal SIN. Therefore, the information of the time difference Δt analyzed through the sampling point P1 can have a more obvious change. As a result, under the circumstances that the frequency f of the input signal SIN is close to ½ the sampling frequency fs (Nyquist frequency), the ADC device 100 can effectively calibrate the clock skew by analyzing the time difference information within even-numbered sampling periods SP (in this example, 2 sampling periods ST) of the clock signals $CLK_0$-$CLK_{M-1}$.

In some related technologies, the skew adjusting circuit 130 analyzes the time difference information within each sampling period of the clock signals. In these technologies, (k+2)T in the above formula (1) needs to be modified to be (k+1)T, and the factor sin(π−πfkΔt) in formula (3) needs to be modified to be sin(π/2−πfkΔt). Accordingly, the information of the time difference Δt is related to the factor sin(π/2). As shown in a waveform 302, when the input signal SIN corresponds to the phase angle π/2, the corresponding sampling point P2 or P3 is located at a position of either a valley or a peak, and the change is relatively small. Therefore, the information of the time difference Δt analyzed through the sampling point P2 or P3 is not sufficient, so the clock skew cannot be effectively calibrated under the circumstances that the frequency f of the input signal SIN is close to ½ the sampling frequency fs (Nyquist frequency).

Figure 4:
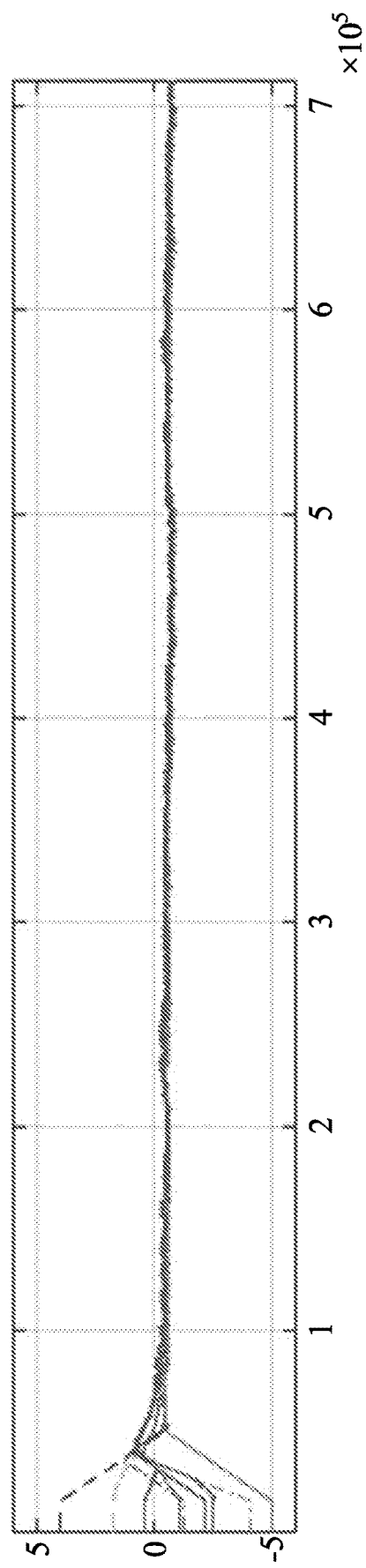
FIG. 4 depicts a schematic diagram showing simulation results of calibrating clock skews according to some embodiments of the present disclosure.

Reference is now made to FIG. 4. FIG. 4 depicts a schematic diagram showing simulation results of calibrating clock skews according to some embodiments of the present disclosure. As shown in FIG. 4, the ADC device 100 in FIG. 1A is disposed to have 8 channels (that is, it has 8 ADC circuits 110), the frequency f of the input signal SIN is set to be 7.8 GHz, and the sampling frequency fs is set to be 16 GHz in one experimental example. Under the circumstances that the frequency f of the input signal SIN is close to ½ the sampling frequency fs (Nyquist frequency), it can be seen that the phase errors between the 8 channels can gradually and correctly converge to zero through the calibration operation of the foregoing embodiment.

Figure 5:
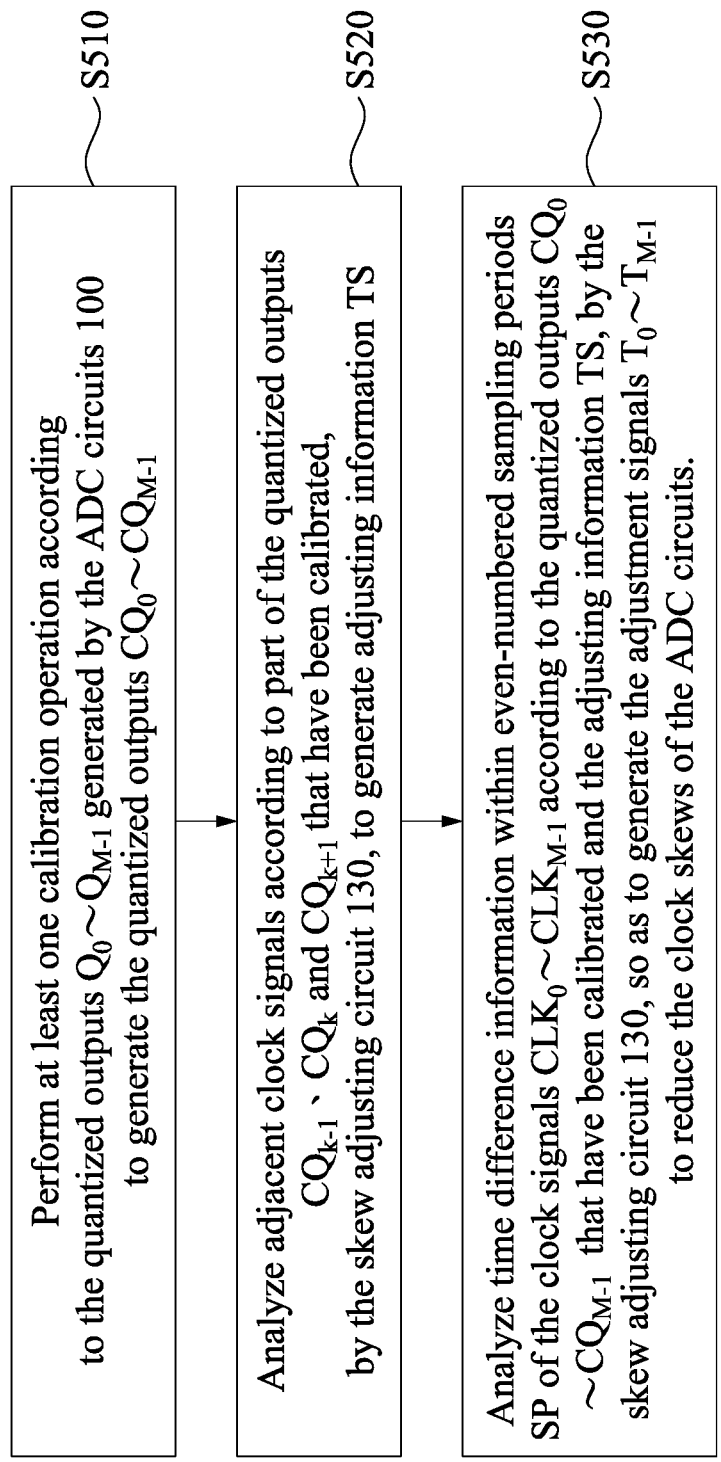
FIG. 5 depicts a flowchart of a method for calibrating a clock skew according to some embodiments of the present disclosure.

Reference is now made to FIG. 5. FIG. 5 depicts a flowchart of a method for calibrating a clock skew 500 according to some embodiments of the present disclosure. For ease of understanding, the method for calibrating the clock skew 500 is described with reference to the foregoing figures. In one embodiment, the method for calibrating the clock skew 500 first executes step S510 to perform at least one calibration operation according to the quantized outputs $Q_0$-$Q_{M-1}$ generated by the ADC circuits 110 to generate the quantized outputs $CQ_0$-$CQ_{M-1}$.

The method for calibrating the clock skew 500 then executes step S520 to analyze adjacent clock signals according to part of the quantized outputs $CQ_{k-1}$, $CQ_k$, and $CQ_{k+1}$ that have been calibrated, by the skew adjusting circuit 130, to generate adjusting information TS.

After that, the method for calibrating the clock skew 500 executes step S530 to analyze time difference information within even-numbered sampling periods SP of the clock signals $CLK_0$-$CLK_{M-1}$ according to the quantized outputs $CQ_0$-$CQ_{M-1}$ that have been calibrated and the adjusting information TS. by the skew adjusting circuit 130, so as to generate the adjustment signals $T_0$-$T_{M-1}$. In this manner, the clock skews of the ADC circuits 110 are reduced. Since the description of the above various operations and their implementation methods may refer to the description of the foregoing embodiments, a description in this regard is not repeated here.

Figure 6:
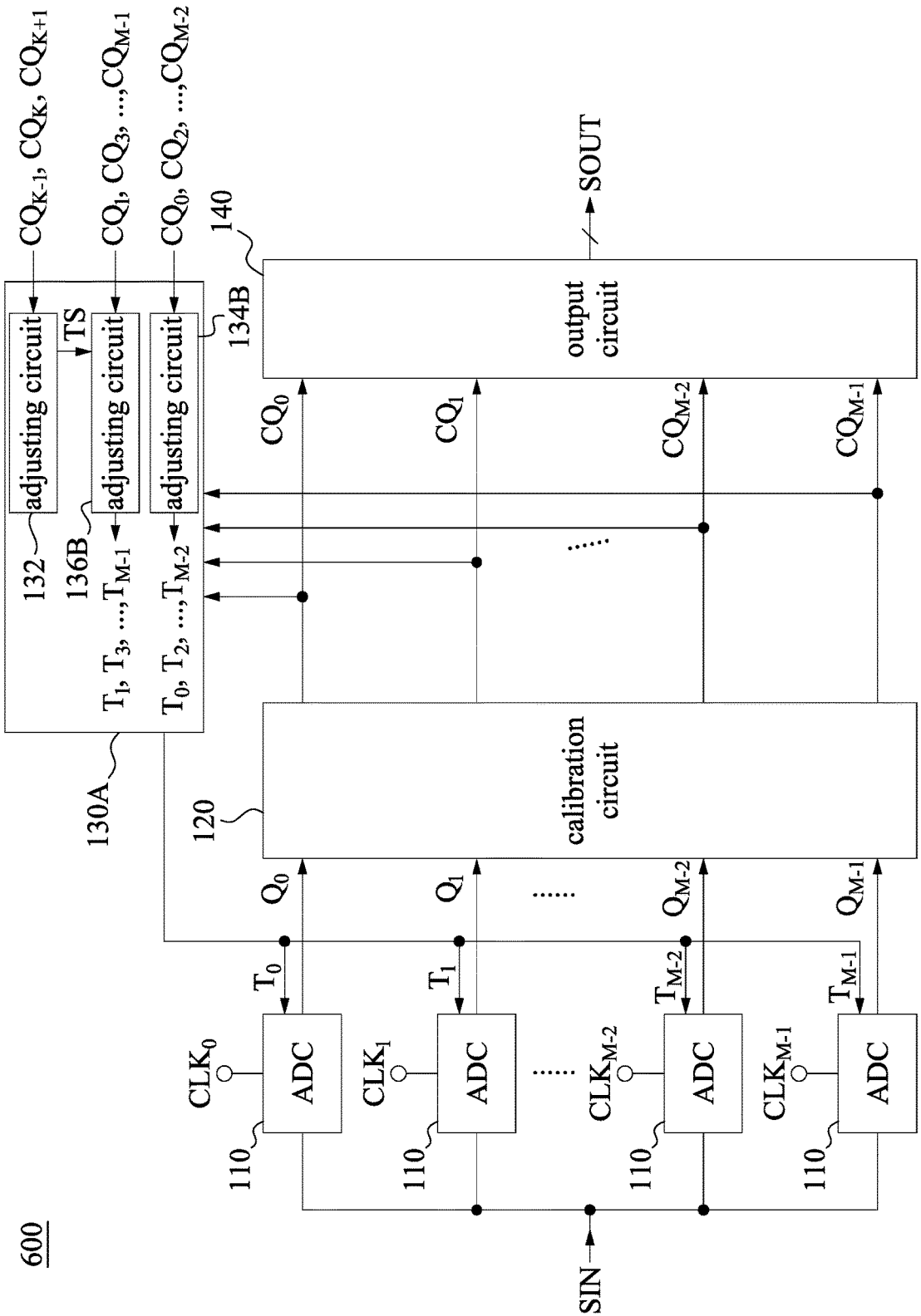
FIG. 6 depicts a schematic diagram of an ADC device according to some embodiments of the present disclosure.

In another embodiment, FIG. 6 depicts a schematic diagram of an ADC device 600 according to some embodiments of the present disclosure. In some embodiments, the ADC device 600 is operated to be a time-interleaved ADC having multiple channels. In the present embodiment, the ADC device 600 and the ADC device 100 are similar. The difference between the two lies in the implementation method of the skew adjusting circuit 130.

As mentioned above, a skew adjusting circuit 130A includes adjusting circuits 132, 134B, and 136B according to the present embodiment. The adjusting circuit 132 is configured to analyze adjacent clock signals according to part of quantized outputs $CQ_k$, $CQ_{k-1}$, and $CQ_{k+1}$ that have been calibrated to generate adjusting information TS. Then, the adjusting circuit 132 is configured to transmit the adjusting information TS to the adjusting circuit 136B. The adjusting circuit 136B is configured to analyze odd-numbered quantized outputs $CQ_1$, $CQ_3$ ... $CQ_{M-1}$ in quantized outputs that have been calibrated according to the adjusting information TS to generate a second part (that is, $T_1$, $T_3$ ... $T_{M-1}$) of a number of adjustment signals $T_0$-$T_{M-1}$.

Figure 7A:
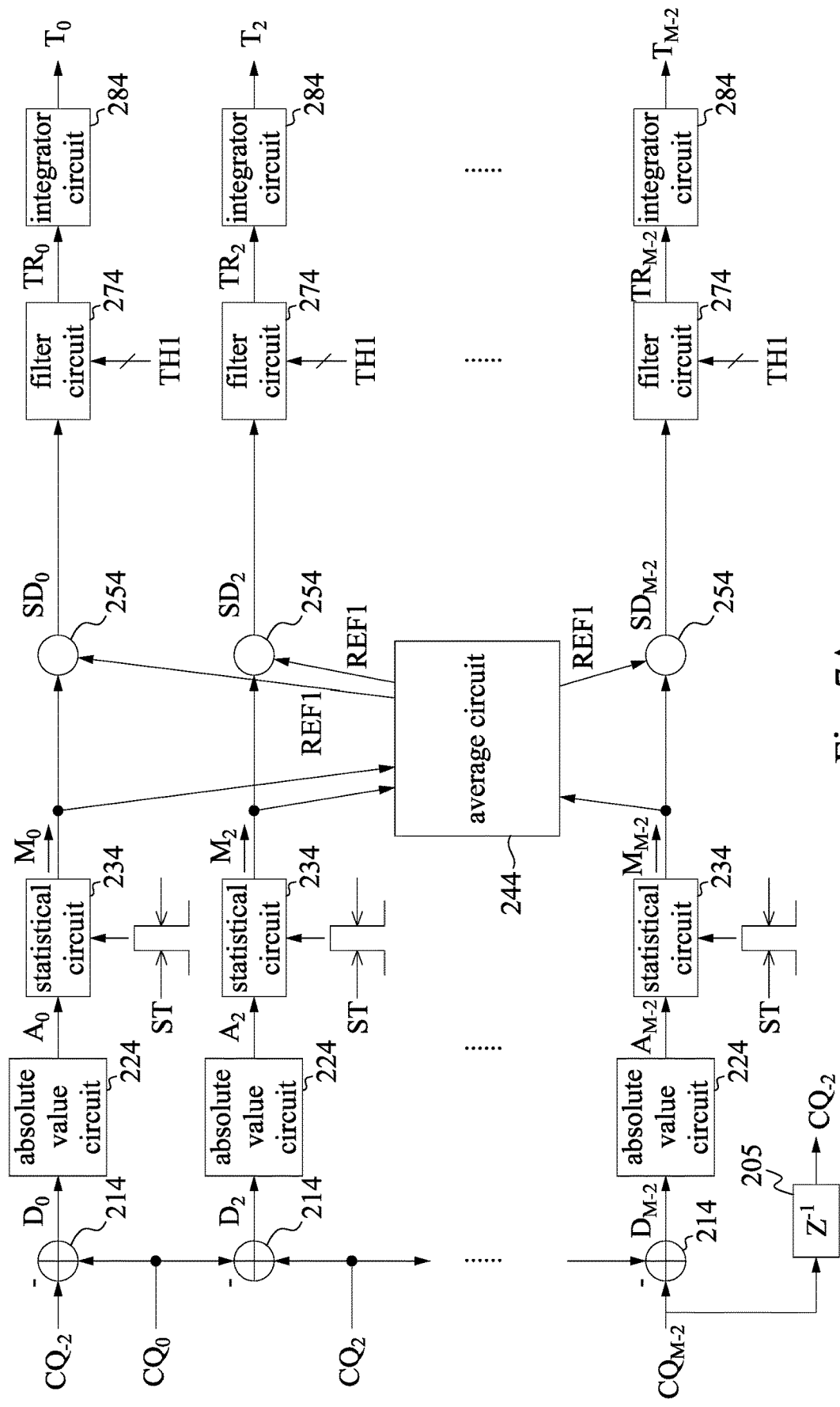
FIG. 7A depicts a schematic circuit diagram of the adjusting circuit in FIG. 6 according to some embodiments of the present disclosure.
Figure 7B:
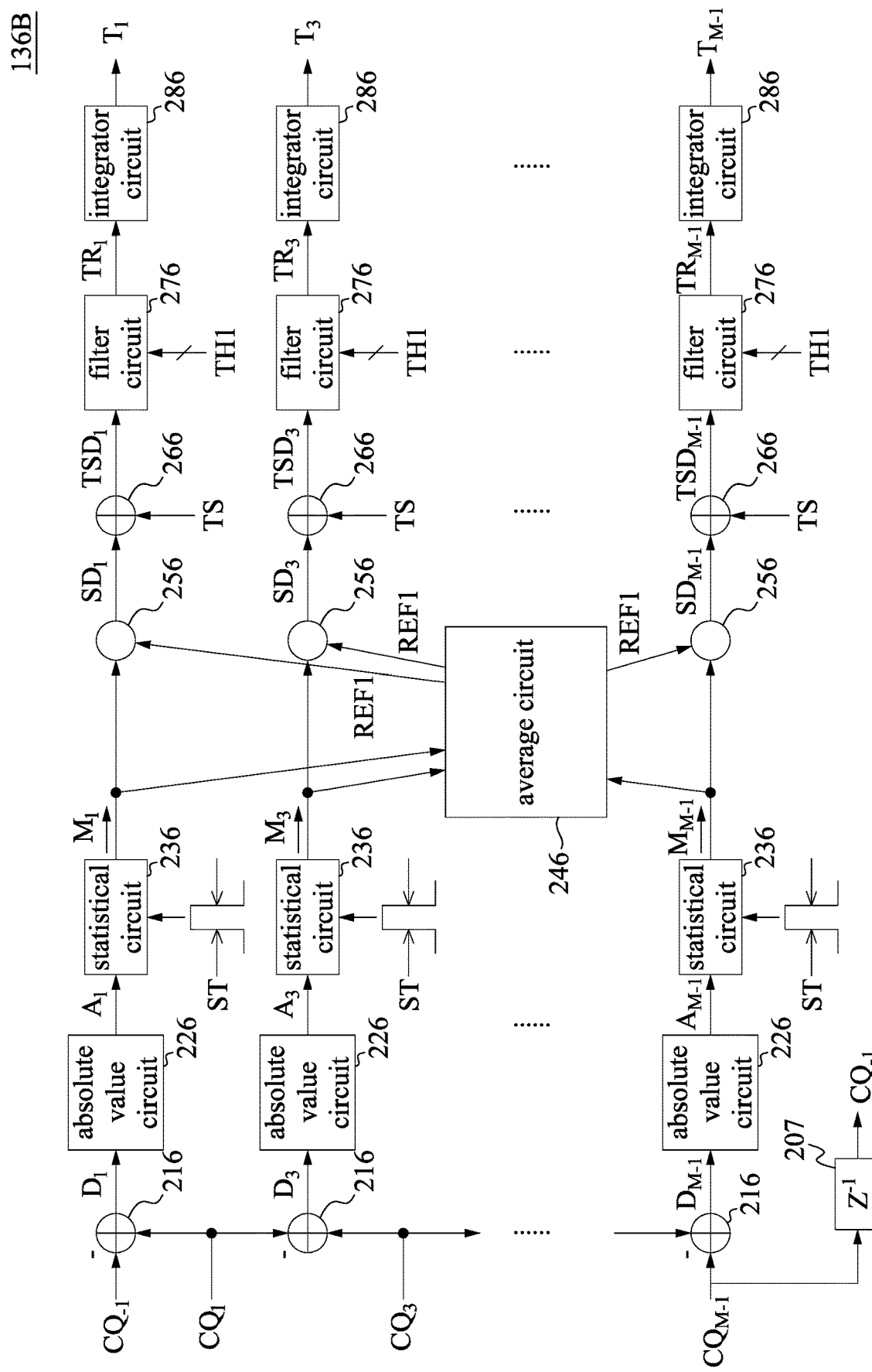
FIG. 7B depicts a schematic circuit diagram of the adjusting circuit in FIG. 6 according to some embodiments of the present disclosure.

As mentioned above, the implementation method of the adjusting circuit 132 shown in FIG. 6 is the same as the implementation method of the adjusting circuit 132 shown in FIG. 1, so a description in this regard is not provided. It is noted that the difference between the embodiment shown in FIG. 6 and the embodiment shown in FIG. 1 lies in the implementation method of the adjusting circuit 134B and the adjusting circuit 136B. Reference is now made to to FIG. 7A and FIG. 7B. FIG. 7A and FIG. 7B depict schematic circuit diagrams of the adjusting circuits in FIG. 6 according to some embodiments of the present disclosure. For ease of understanding, similar elements in FIG. 7A and FIG. 7B are designated with the same reference numbers as in FIG. 6.

As mentioned above, the adjusting circuit 134B includes the delay circuit 205, the computation circuits 214, the absolute value circuits 224, the statistical circuits 234, the average circuit 244, and the comparison circuits 254, as shown in FIG. 7A. In some embodiments, the functions of the circuits and/or elements in the adjusting circuit 134B are similar to the functions of the circuits and/or elements in the adjusting circuit 134A, so a description in this regard is not repeated here. Additionally, in some embodiments, since the operation methods of the adjusting circuit 134B are similar to those of the adjusting circuit 136A, a description in this regard is not provided.

Then, as shown in FIG. 7B, the adjusting circuit 136B includes the delay circuit 207, the computation circuits 216, the absolute value circuits 226, the statistical circuits 236, the average circuit 246, the comparison circuits 256, and a number of computation circuits 266. In some embodiments, the functions of the circuits and/or elements in the adjusting circuit 136B are similar to the functions of the circuits and/or elements in the adjusting circuit 134A, so a description in this regard is not repeated here.

As mentioned above, the computation circuits 266 are electrically coupled to the comparison circuits 256. The computation circuits 266 receive corresponding detection signals $SD_1$, $SD_3$ ... $SD_{M-1}$ in sequence to perform addition operations with the adjusting information TS so as to generate detection signals $TSD_1$, $TSD_3$ ... $TSD_{M-1}$ that have been adjusted. The first computation circuit 266 is taken for example. The first computation circuit 266 receives the detection signal $SD_1$ and the adjusting information TS, and adds the detection signal $SD_1$ to the adjusting information TS to generate the detection signals $TSD_1$ that has been adjusted. Since the disposition method and operation of the remaining computation circuits 266 can be deduced by analogy, a description in this regard is not repeated here. In some embodiments, the implementation method of the computation circuit 266 is the same as that of the computation circuit 264, so a description in this regard is not provided. Because the operation methods of the adjusting circuit 136B are all similar to those of the adjusting circuit 134A, a description in this regard is not repeated here.

In summary, the ADC device and method for calibrating the clock skew according to the present disclosure mainly utilize the analysis of the time difference information within even-numbered sampling periods of the clock signals and the auxiliary adjusting information to perform calibration. As a result, the clock skew can still be calibrated effectively when the frequency of the input signal is close to the Nyquist frequency. In this manner, the overall power consumption and calibration period can be reduced.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An analog to digital converter device comprising:
   a plurality of analog to digital converter circuits configured to convert an input signal to generate a plurality of first quantized outputs according to a plurality of clock signals;
   a calibration circuit configured to perform at least one calibration operation according to the first quantized outputs to generate a plurality of second quantized outputs; and
   a skew adjusting circuit further comprising:
      a first adjusting circuit configured to analyze adjacent clock signals of the plurality of clock signals according to a part of the plurality of second quantized outputs to generate adjusting information;
   wherein the skew adjusting circuit is configured to analyze time difference information within even-numbered sampling periods of the plurality of clock signals according to the plurality of second quantized outputs and the adjusting information to generate a plurality of adjustment signals, wherein the plurality of adjustment signals are configured to reduce at least one clock skew of the plurality of analog to digital converter circuits.

2. The analog to digital converter device of claim 1, wherein the first adjusting circuit further comprises:
   a plurality of computation circuits configured to receive the part of the second quantized outputs, and configured to generate a plurality of first difference signals according to two of the part of the plurality of second quantized outputs, respectively;
   a plurality of first absolute value circuits, wherein each of the plurality of first absolute value circuits is configured to perform an first absolute value operation according to a corresponding first difference signal of the plurality of first difference signals, to generate an first absolute value signal correspondingly;
   a plurality of first statistical circuits, wherein each of the first statistical circuits is configured to receive the first absolute value signal correspondingly during a predetermined period, and perform a first statistical operation to output a first calculation signal correspondingly;
   an first average circuit configured to perform an first average value operation to average the first calculation signals, to generate a first reference signal; and
   a first comparison circuit configured to compare each of the first calculation signals with the first reference signal, to generate the adjusting information.

3. The analog to digital converter device of claim 2, wherein the skew adjusting circuit further comprises:
   a second adjusting circuit configured to analyze a plurality of even-numbered quantized outputs of the plurality of second quantized outputs, according to the adjusting information, to generate a first part of the plurality of adjustment signals; and
   a third adjusting circuit configured to analyze a plurality of odd-numbered quantized outputs of the plurality of second quantized outputs, to generate a second part of the plurality of adjustment signals.

4. The analog to digital converter device of claim 3, wherein the second adjusting circuit further comprises:
   a delay circuit configured to delay a last one of the plurality of even-numbered quantized outputs to generate a delayed quantized output;

a plurality of first computation circuits configured to receive the delayed quantized output and the plurality of even-numbered quantized outputs in sequence, and the plurality of first computation circuits is configured to generate a plurality of second difference signals according to two signals of the delayed quantized output and the plurality of second quantized outputs respectively;

a plurality of second absolute value circuits, wherein each of the second absolute value circuits is configured to perform a second absolute value operation according to a corresponding second difference signal of the plurality of second difference signals, to generate a second absolute value signal correspondingly;

a plurality of second statistical circuits, wherein each of the plurality of second statistical circuits is configured to receive the second absolute value signal correspondingly during the predetermined period, and is configured to perform a second statistical operation to output a second calculation signal correspondingly;

an second average circuit configured to perform a second average value operation to average the second calculation signals, to generate a second reference signal;

a plurality of second comparison circuits configured to compare the second calculation signals with the second reference signal to generate a plurality of detection signals; and a plurality of second computation circuits, wherein each of the second computation circuits is configured to perform an addition operation according to the adjusting information and a corresponding detection signal of the plurality of detection signals, to generate the first part of the plurality of adjustment signals.

5. The analog to digital converter device of claim 3, wherein the third adjusting circuit further comprises:
a delay circuit configured to delay a last one of the plurality of odd-numbered quantized outputs to generate a delayed quantized output;

a plurality of first computation circuits configured to receive the delayed quantized output and the plurality of odd-numbered quantized outputs in sequence, and the plurality of first computation circuits is configured to generate a plurality of second difference signals according to two signals of the delayed quantized output and the plurality of second quantized outputs respectively;

a plurality of second absolute value circuits, wherein each of the second absolute value circuits of the third adjusting circuit is configured to perform a second absolute value operation according to a corresponding second difference signal of the plurality of second difference signals, to generate a second absolute value signal correspondingly;

a plurality of second statistical circuits, wherein each of the plurality of second statistical circuits is configured to receive the second absolute value signal correspondingly during the predetermined period, and is configured to perform a second statistical operation to output a second calculation signal correspondingly;

an second average circuit configured to perform a second average value operation to average the second calculation signals, to generate a second reference signal; and a plurality of second comparison circuits configured to compare the second calculation signals with the second reference signal to generate a plurality of detection signals, wherein the plurality of detection signals are the second part of the plurality of adjustment signals.

6. A method for calibrating a clock skew comprising:
performing at least one calibration operation according to a plurality of first quantized outputs generated by a plurality of analog to digital converter circuits to generate a plurality of second quantized outputs;

analyzing adjacent clock signals of the plurality of clock signals, according to a part of the plurality of second quantized outputs, by a skew adjusting circuit, to generate adjusting information; and analyzing time difference information within even-numbered sampling periods of plurality of clock signals according to the plurality of second quantized outputs and the adjusting information, by the skew adjusting circuit, to generate a plurality of adjustment signals;

wherein the adjustment signals are configured to reduce at least one clock skew of the analog to digital converter circuits.

7. The method for calibrating the clock skew of claim 6, wherein generating the adjusting information comprises:
receiving the part of the plurality of second quantized outputs in sequence, and generating a plurality of first difference signals according to two of the part of the second quantized outputs, by a plurality of computation circuits, respectively;

performing an first absolute value operation according to a corresponding first difference signal of the plurality of first difference signals to generate an first absolute value signal correspondingly;

receiving the first absolute value signal correspondingly during a predetermined period, and performing a first statistical operation to output a first calculation signal correspondingly;

performing an first average value operation to average the first calculation signals to generate a first reference signal; and comparing each of the first calculation signals with the first reference signal to generate the adjusting information.

8. The method for calibrating the clock skew of claim 7, wherein generating the plurality of adjustment signals comprises:
analyzing a plurality of even-numbered quantized outputs of the plurality of second quantized outputs, according to the adjusting information, by the skew adjusting circuit, to generate a first part of the plurality of adjustment signals; and analyzing a plurality of odd-numbered quantized outputs of the plurality of second quantized outputs, by the skew adjusting circuit, to generate a second part of the plurality of adjustment signals.

9. The method for calibrating the clock skew of claim 8, wherein generating the first part of the adjustment signals comprises:
delaying a last one of the plurality of even-numbered quantized outputs to generate a delayed quantized output;

receiving the delayed quantized output and the plurality of even-numbered quantized outputs in sequence, and generating a plurality of second difference signals according to two signals of the delayed quantized output and the plurality of second quantized outputs respectively;

performing an second absolute value operation according to a corresponding second difference signal of the plurality of second difference signals, to generate an second absolute value signal correspondingly;

receiving the second absolute value signal correspondingly during the predetermined period, and performing a second statistical operation to output a second calculation signal correspondingly;

performing an second average value operation to average the second calculation signals to generate a second reference signal;

comparing the second calculation signals with the second reference signal to generate a plurality of detection signals; and performing an addition operation according to the adjusting information and a corresponding detection signal of the plurality of detection signals to generate the first part of the plurality of adjustment signals.

10. The method for calibrating the clock skew of claim 8, wherein generating the second part of the adjustment signals comprises:

delaying a last one of the plurality of odd-numbered quantized outputs to generate a delayed quantized output;

receiving the delayed quantized output and the plurality of odd-numbered quantized outputs in sequence, and generating a plurality of second difference signals according to two signals of the delayed quantized output and the plurality of second quantized outputs respectively;

performing an second absolute value operation according to a corresponding second difference signal of the plurality of second difference signals, to generate an second absolute value signal correspondingly;

receiving the second absolute value signal correspondingly during the predetermined period, and performing a second statistical operation to output a second calculation signal correspondingly;

performing an second average value operation to average the second calculation signals to generate a second reference signal; and comparing the second calculation signals with the second reference signal to generate a plurality of detection signals, wherein the detection signals are the second part of the adjustment signals.

* * * * *